United States Patent [19]
Prasanna et al.

[11] Patent Number: 6,163,474
[45] Date of Patent: Dec. 19, 2000

[54] MEMORY CARD WHICH IS THERMALLY CONTROLLED

[75] Inventors: Rangarajan K. Prasanna, Beaverton; Murlidhar Tirumala, Portland, both of Oreg.

[73] Assignee: Intel Corporation, Santa Clara, Calif.

[21] Appl. No.: 09/225,927

[22] Filed: Jan. 5, 1999

[51] Int. Cl.$^7$ .................................................. G11C 5/02
[52] U.S. Cl. .................... 365/52; 365/51; 365/63
[58] Field of Search .................. 365/51, 52, 63

[56] References Cited

U.S. PATENT DOCUMENTS

| | | | |
|---|---|---|---|
| 5,189,638 | 2/1993 | Kimura | 365/52 |
| 5,448,511 | 9/1995 | Paurus et al. | 365/52 |
| 5,574,682 | 11/1996 | Shinohara | 365/164 |
| 5,710,733 | 1/1998 | Chengson et al. | 365/52 |

*Primary Examiner*—Son T. Dinh
*Attorney, Agent, or Firm*—Blakely, Sokoloff, Taylor & Zafman LLP

[57] ABSTRACT

A cartridge comprising a substrate, at least a first set of dies, at least a first thermally conductive cover and at least a first compliant thermally conductive pad. The substrate has first and second opposed sides and electrical contacts along an edge thereof. The dies of the first set have first and second opposed faces. The dies of the first set are mounted to the first side of the substrate with the first face of each die facing towards the first side of the substrate. The first thermally conductive cover has first and second opposed surfaces and is mounted over the dies with the first surface of the first thermally conductive cover facing towards the dies. The thermally conductive pad is located between the first set of dies and the thermally conductive cover thermally couples the second faces of at least two of the dies of the first set and the first surface of the first cover with one another.

14 Claims, 3 Drawing Sheets

MEMORY CARD WHICH IS THERMALLY CONTROLLED

BACKGROUND OF THE INVENTION

1. Field of the Invention

The present invention relates generally to a cartridge such as a memory cartridge including a memory card and, more specifically, to thermal control of such a memory card.

2. Discussion of Related Art

Computer memory is often provided in the form of a memory card comprising a substrate with a number of memory dies assembled into packages that are soldered to the substrate. Electrical contacts are provided on the card, usually along an edge of the card so that the card can be inserted into a memory bus of a computer. The memory dies are typically dynamic random access memory (DRAM) memory dies.

In the past, the memory dies themselves were operable at relatively low speeds. These memory dies were also mounted to substrates in a manner wherein relatively long metal interconnects had to be formed in or on the substrates for purposes of accessing the memory dies electrically. The relatively long metal interconnects also inhibited the speed of the memory cards as a whole. The operable speeds of memory cards in the past were typically in the region of about 50 megabits per second (MB/s). Due to the relatively low speeds of the memory dies and the memory cards, relatively little problems were encountered due to overheating of the memory dies or due to excessive electromagnetic radiation from the memory cards.

The speeds at which memory currently operate are typically at least 400 MB/s. Certain computer memory cards such as the proposed Direct Rambus™ DRAM (Direct RDRAM) memory currently operate at speeds of 1.6 gigabits per second (GB/s).

One advancement in memory cards is the mounting of memory dies on a substrate in what is generally referred to in the art as a "chip scale package". In a chip scale package, memory dies are mounted to a substrate by an array of solder balls known in the art as a "micro-ball grid array". A micro-ball grid array generally allows for memory dies to be assembled in packages by being mounted to a die substrate over an area of the die substrate which is less than 1.2 times the area of the individual memory dies. Such packages, in turn, allow for closer positioning of the memory dies to one another, typically in an area which is less than 1.2 times the combined areas of the respective memory dies. By closely spacing the memory dies relative to one another, relatively short interconnects are formed in or on the substrates for purposes of accessing the memory dies electrically. By shortening the interconnects, data transactions can generally be transmitted to and from the memory dies at faster speeds.

The higher speeds at which memory operates have also come with certain penalties. In particular, memory cards are more prone to overheating than in the past. Memory cards also emit more electromagnetic radiation to surrounding areas than in the past, which could affect the electrical performance of computer components which are located in an area near the memory cards.

SUMMARY OF THE INVENTION

A cartridge comprising a substrate, at least a first set of dies, at least a first thermally conductive cover and at least a first compliant thermally conductive pad. The substrate has first and second opposed sides and electrical contacts along an edge thereof. The dies of the first set have first and second opposed faces. The dies of the first set are mounted to the first side of the substrate with the first face of each die facing towards the first side of the substrate. The first thermally conductive cover has first and second opposed surfaces and is mounted over the dies with the first surface of the first thermally conductive cover facing towards the dies. The thermally conductive pad is located between the first set of dies and the thermally conductive cover thermally couples the second faces of at least two of the dies of the first set and the first surface of the first cover with one another.

BRIEF DESCRIPTION OF THE DRAWINGS

The invention is further described by way of example with reference to the accompanying drawings wherein.

DETAILED DESCRIPTION OF THE PRESENT INVENTION

A memory cartridge is described. The memory cartridge has a substrate with a plurality of memory dies mounted to the substrate in the form of a chip scale package. Thermally conductive covers are also mounted to the substrate. The thermally conductive covers are thermally coupled to the memory dies and serve to conduct heat away from the memory dies.

Figure 2:
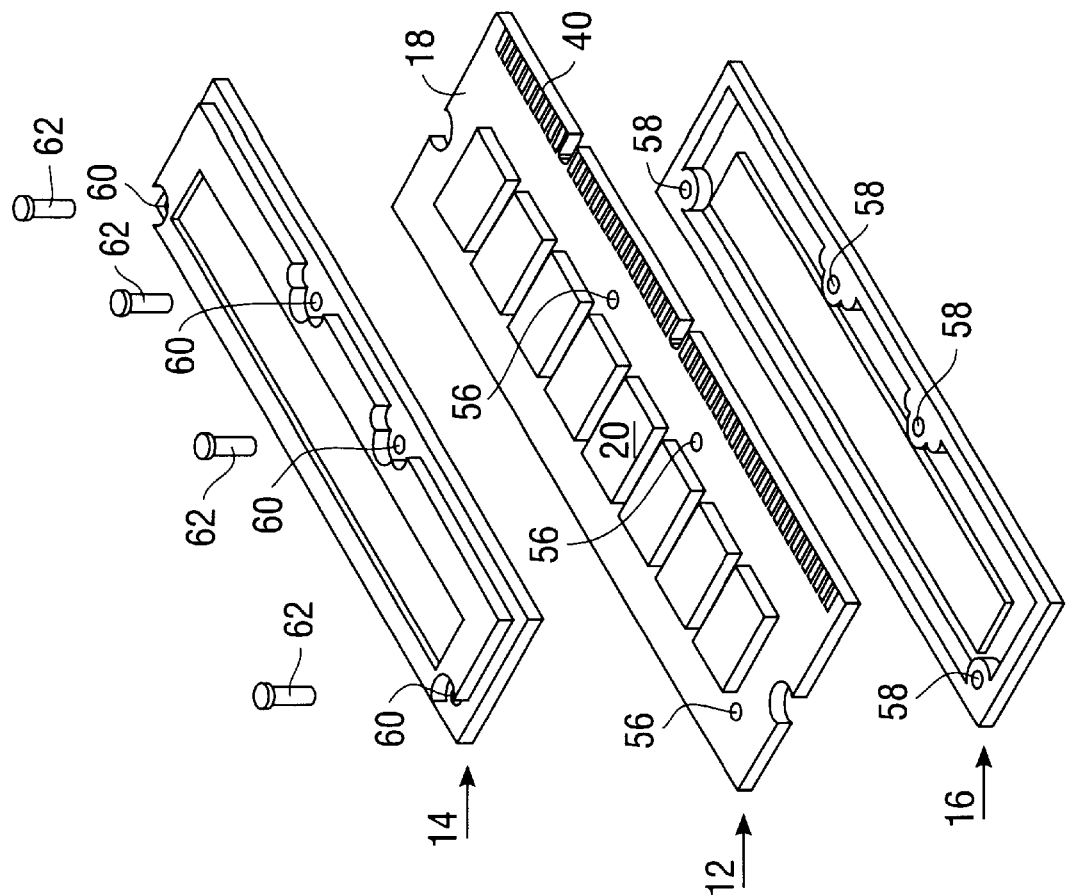
FIG. 2 is an exploded, perspective view of the memory cartridge, showing a memory card and upper and lower thermally conductive covers forming part of the memory cartridge.
Figure 1:
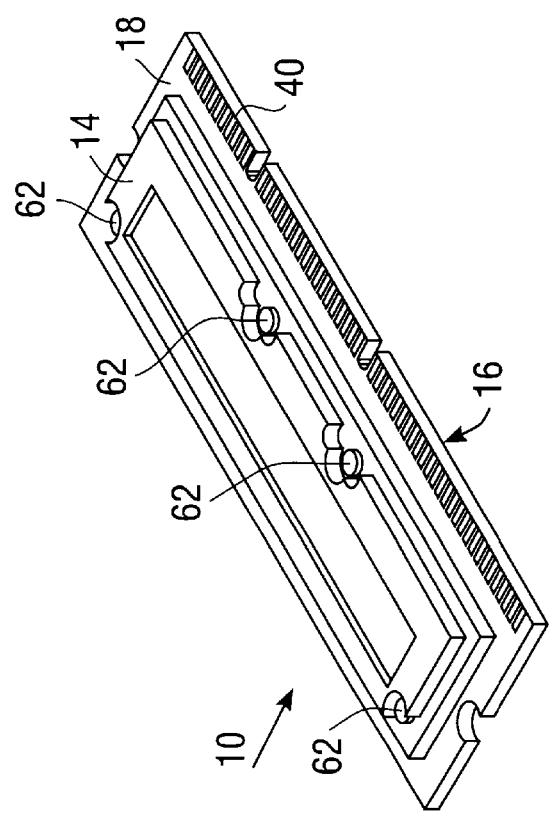
FIG. 1 is a perspective view of a fully assembled memory cartridge according to an embodiment of the invention.

FIG. 1 of the accompanying drawings illustrates a memory cartridge 10, according to an embodiment of the invention, and FIG. 2 illustrates the memory cartridge 10 in exploded form.

The memory cartridge 10 includes a memory card 12, an upper thermally conductive cover 14, and a lower thermally conductive cover 16. The thermally conductive covers 14 and 16 may be made of any material with suitable thermal conductivity properties such as copper or aluminum.

Figure 3:
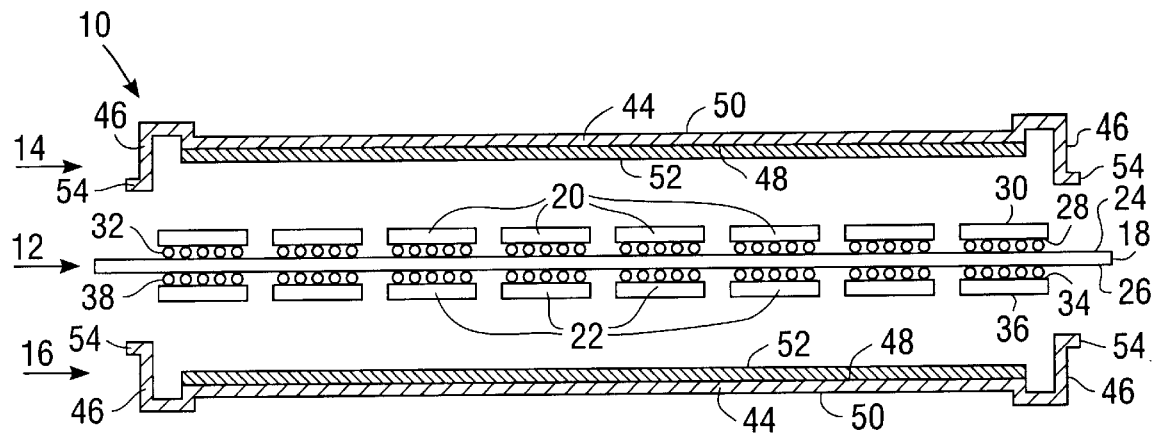
FIG. 3 is an exploded, partially sectioned side view of the memory cartridge, showing the memory card and the upper and lower thermally conductive covers.

FIG. 3 is a partially sectioned side view of the memory cartridge 10 in exploded form, showing the memory card 12, the upper thermally conductive cover 14 and the lower thermally conductive cover 16.

The memory card 12 includes a substrate 18, an upper set of memory dies 20, and a lower set of memory dies 22 which are assembled into packages such as micro-ball grid array packages.

The substrate 18 has an upper side 24 and a lower side 26. Each one of the memory dies 20 has a lower face 28 and an upper face 30. The lower face 28 of each memory die 20 faces towards the upper side 24 of the substrate 18. A respective array of solder balls 32 is located between each respective die 20 and the substrate 18 and mounts the respective die 20 to the substrate 18.

Similarly, each of the memory dies 22 has an upper face 34, and a lower face 36, the respective upper faces 34 of the respective memory dies 22 facing towards the lower side 26 of the substrate 18. A respective array of solder balls 38 is located between each respective memory die 22 and the substrate 18 and mounts the respective memory die 22 to the substrate 18.

The solder balls 32 and 38 may be in what is known in the art as a "micro-ball grid array". A micro-ball grid array allows for the memory dies 20 and 22 to be positioned relatively closely to one another in what is known in the art as a "chip scale package". A chip scale package generally has shorter interconnects in and on the substrate 18 for electrically accessing the memory dies 20 and 22 than other semiconductor packages. By shortening the interconnects, electrical signals can be relayed to and from the memory dies 20 and 22 at higher frequencies. The memory dies 20 and 22 may be dynamic random access memory (DRAM) memory dies, which, due to the chip scale package configuration, may operate at speeds of at least 400 MB/s. In particular, the memory card 12 may be a chip scale package such as a Direct Rambus™ DRAM (Direct RDRAM) package which is operable at a speed of at least 1.6 GB/s per second.

Figure 4:
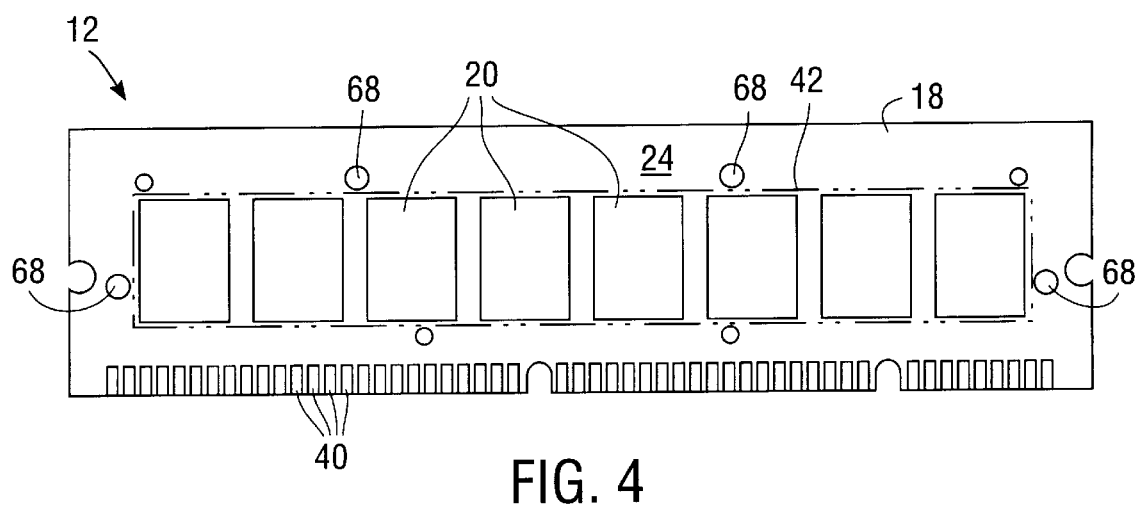
FIG. 4 is a plan view of the memory card forming part of the memory cartridge.

FIG. 4 is a view of the memory card 12 which shows the upper side 24 of the substrate 18 and the memory dies 20 located on the upper side 24 of the substrate 18.

The substrate 18 has a substantially rectangular shape. Electrical contacts 40 are formed along one long edge of the substantially rectangular substrate 18.

The memory dies 20 are located substantially in line on the upper side 24 of the substrate 18, and in an area indicated by the phantom line 42. In a chip scale package, the area 42 may be less that 1.2 times the combined areas of the upper side 24 of the substrate 18 covered by the respective dies 20.

Referring again to FIG. 3, the upper thermally conductive cover 14 and the lower thermally conductive cover 16 each have a central region 44 and an edge region 46 around the central region 44 of the respective thermally conductive cover 14 or 16.

The central region 44 of each thermally conductive cover 14 or 16 has first and second opposed surfaces, 48 and 50 respectively, with the first surface 48 facing towards the memory card 12. A compliant thermally conductive pad 52 is located on the first surface 48 of each thermally conductive cover 14 and 16. The pads 52 may be pads sold as "Gap Pad 2000" by Bergquisp of Portland, Oreg. or be pads sold as "T-Pli" by Thermagon of Portland, Oreg. The pads 52 may also include other materials such as a thermal grease or a thermal epoxy.

The edge region 46 of the respective thermally conductive cover 14 or 16 terminates in a transversely extending gasket-like seat 54.

The second surface 50 of the central region 44 of each thermally conductive cover 14 or 16 is substantially flat for purposes as will be further discussed hereinbelow.

Figure 5:
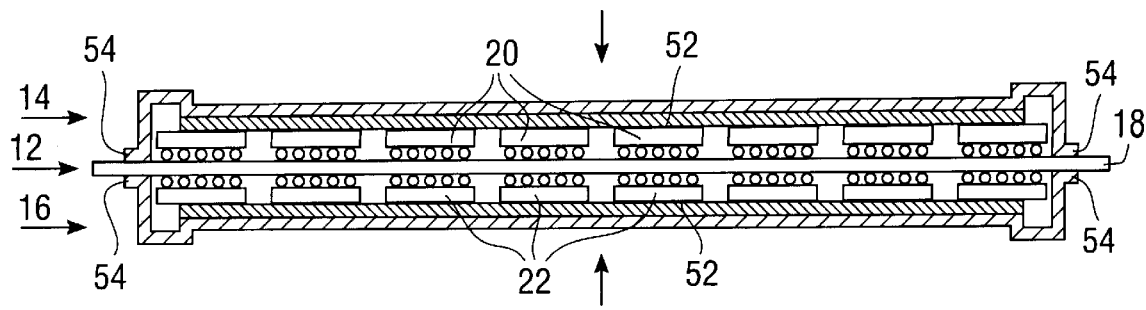
FIG. 5 is a partially sectioned side view similar to FIG. 3 wherein the memory card and the upper and lower thermally conductive covers are assembled into a memory cartridge.

FIG. 5 illustrates the upper and lower thermally conductive covers 14 and 16 assembled to the memory card 12. The upper thermally conductive cover 14 is assembled to the memory card 12 so that the seat 54 of the upper thermally conductive cover 14 contacts the substrate 18 in an area around the memory dies 20 with long edges of the seat 54 located along all the memory dies 20. The thermally conductive pad 52 on the first surface 48 of the central region 44 of the upper thermally conductive cover 14 is spaced from the seat 54 of the upper thermally conductive cover 14 so that the pad 52 is in contact with the memory dies 20 when the seat 54 of the upper thermally conductive cover 14 contacts the substrate 18. The edge regions 46 so provide a pedestal which rests on the substrate 18 and so prevents mechanical damage of the central region 44 and to the memory dies 20. Proper contact with all the memory dies 20 is ensured due to compliance of the thermally conductive pad 52. The upper thermally conductive cover 14 is so thermally coupled to the memory dies 20 through the pad 52.

Similarly, the seat 54 of the lower thermally conductive cover 16 contacts the lower surface of the substrate 18 and the thermally conductive pad 52 on the central region 44 of the lower thermally conductive cover 16 is spaced from the seat 54 so that the pad 52 is in contact with the memory dies 22 on the lower side 26 of the substrate 18.

Referring again to FIG. 2, holes 56 are drilled through the substrate 18 of the memory card 12. Holes 58 are punched through the lower thermally conductive cover 16. Holes 60 are also punched through the upper thermally conductive cover 14. When the memory card 12 and the upper and lower thermally conductive covers 14 and 16 are brought together, the holes 56, 58 and 60 are brought into register with one another.

Fasteners such as rivets 62 may be inserted through the holes 56, 58 and 60 for purposes of securing the upper and lower thermally conductive covers 14 and 16 to the substrate 18 of the memory card 12.

As can be seen in FIG. 1, the upper thermally conductive cover 14 is slightly smaller than the substrate 18 so that the electrical contacts 40 are not obscured by the upper thermally conductive cover 14. The lower thermally conductive cover 16 is located in a similar manner on the lower side 26 of the substrate 18.

In use, the long edge of the substrate 18 of the memory card 12 is inserted into a complementary bus of a computer.

Data may be transferred between the electrical contacts 40 and the memory dies 20 and 22. As previously mentioned, the memory card 12 may be in the form of a chip scale package wherein the memory dies 20 and 22 are located relatively closely to one another. As also previously mentioned, data may be transferred at relatively high speeds. The combined effect of the relatively high speed of the data transactions and the memory dies 20 and 22 being located relatively closely to one another may result in a relatively large amount of heat per unit area being dissipated by the memory dies 20 and 22, and the memory card 12 as a whole. The whole memory card 12 may produce heat at more than 4 watt, although a single memory die 20 or 22 may produce at least 2 watt of heat.

The heat generated by the memory card 12 is conducted through the thermally conductive pads 52 to the thermally conductive covers 14 and 16. The memory cartridge may be located on the computer in an orientation wherein the substantially flat second surfaces 50 of the respective thermally conductive covers 14 and 16 are substantially vertical. Heat may then convect from the respective thermally conductive covers 14 and 16 by flowing upwardly over the second surfaces 50 of the respective thermally conductive covers 14 and 16, thereby removing heat from the thermally conductive covers 14 and 16 by convection. By making the second surfaces 50 of the respective thermally conductive covers 14 and 16 substantially flat, the positioning of the memory cartridge 10 is less orientation dependent. The memory cartridge 10 may therefore be connected to a horizontally or vertically extending bus of a computer while still allowing vertical flow over the respective second surfaces 50 of the thermally conductive covers 14 and 16.

Figure 6:
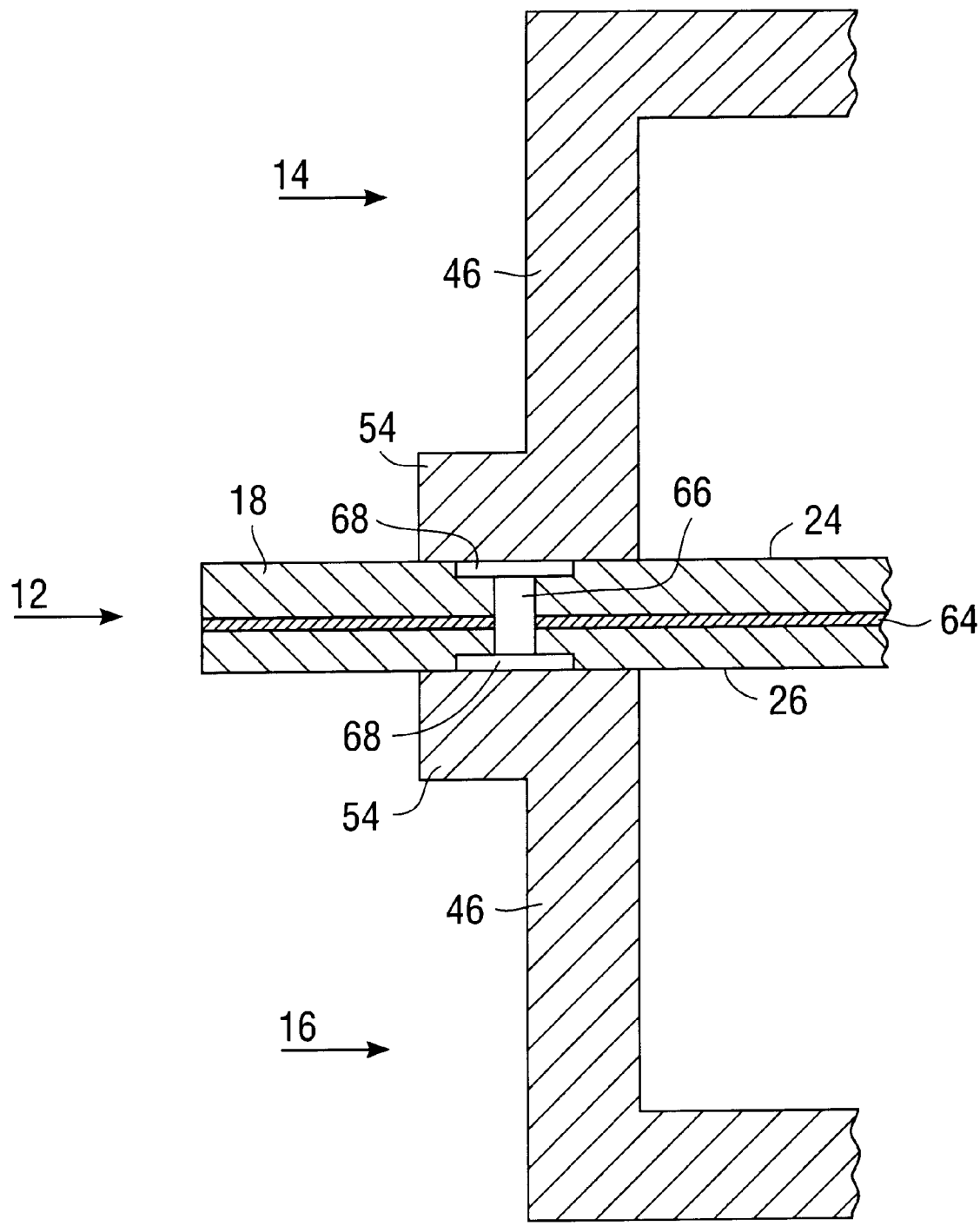
FIG. 6 is a sectioned side view of a portion of the memory cartridge illustrating how the upper and lower thermally conductive covers are grounded to reduce electromagnetic radiation from the memory card.

FIG. 6 is a cross-sectional view of a portion of the memory cartridge 10 showing only an edge of the substrate 18 of the memory card 12, and the edge regions 46 of the respective thermally conductive covers 14 and 16.

The substrate 18 may include a number of layers including a metal layer 64 which serves as an electrical ground for the electronics of the memory dies 20 and 22. In the present embodiment the grounding layer 64 is located between the upper and lower sides 24 and 26 within the substrate 18.

A number of metal ground or plug vias 66 (only one of which is shown in FIG. 6) are formed in the substrate 18, each metal plug via 66 being in contact with the grounding layer 64. Metal contact pads 68 can be formed within the upper and lower sides 24 and 26 of the substrate 18 and are in contact with the metal plug via 66.

The seat 54 of each thermally conductive cover 14 or 16 is in contact with a respective contact pad 68 and electrically connected to the grounding layer 64. More particularly, the central region 44 of each respective thermally conductive cover 14 or 16 is electrically connected to the grounding layer 64 through an edge region 46 of the respective thermally conductive cover 14 or 16, one of the contact pads 68, and the metal plug via 66.

The contact pads 68 and metal plug vias 66 may be located at various locations on the substrate 18. FIG. 4 shows that, in the present embodiment, contact pads 68 are located at various locations around the memory dies 20. The upper thermally conductive cover 14 is located on the substrate 18 so as to contact each of the contact pads 68. Although the contact pads 68 on the lower side 26 of the substrate 18 are not shown, it is to be understood that a number of contact pads are also formed on the lower side 26 of the substrate 18 and that the lower thermally conductive cover 16 contacts each of the contact pads 68 on the lower sides 26 of the substrate 18.

Switching circuits of the memory dies 20 and 22 may create magnetic fields around the cartridge 10. The magnetic fields may create noise within the computer.

The thermally conductive covers 14 and 16 are connected to the grounding layer 64. Electromagnetic energy generated by the memory dies 20 and 22 is so conducted to the grounding layer 64 through the thermally conductive covers 14 and 16. The covers 14 and 16 thus create an electromagnetic shield.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

We claim:

1. A cartridge comprising:
    a substrate having first and second opposed sides and electrical contacts along an edge thereof;
    at least a first set of dies, each having first and second opposed faces, mounted to the first side of the substrate with the first face of each die of the first set facing towards the first side of the substrate;
    at least a first thermally conductive cover mounted over the first set of dies, the first thermally conductive cover having first and second opposed surfaces, wherein the first surface of the first thermally conductive cover faces towards the first set of dies; and
    at least a first compliant thermally conductive pad, located between the first set of dies and the first thermally conductive cover, which thermally couples the second faces of at least two dies of the first set and the first surface of the first cover with one another.

2. The cartridge of claim 1, wherein the first set of dies are located on an area of the first side of the substrate which is less than 1.2 times the combined areas of the first side of the substrate covered by the individual respective dies of the first set.

3. The cartridge of claim 2 further comprising a respective micro ball grid array mounting each respective die to the substrate.

4. The cartridge of claim 1, wherein the second surface of the first thermally conductive cover is substantially flat.

5. The cartridge of claim 2, wherein the dies are DRAM memory dies.

6. The cartridge of claim 2, wherein the dies are operable at a speed of at least 400 megabits per second.

7. The cartridge of claim 1, wherein the first thermally conductive cover is made of a material selected from the group consisting of aluminum and copper.

8. The cartridge of claim 1 further comprising:
    a second set of dies, each having first and second opposed faces, mounted to the second side of the substrate with the first face of each die of the second set facing towards the second side of the substrate;
    at least a second thermally conductive cover mounted over the second set of dies, the second thermally conductive cover having first and second opposed surfaces, wherein the first surface of the second thermally conductive cover faces towards the second set of dies; and
    a second compliant thermally conductive pad, located between the second set of dies and the second thermally conductive cover, which thermally couples the second faces of at least two dies of the second set and the first surface of the second cover with one another.

9. The cartridge of claim 8 wherein the second set of dies are located on an area of the second side of the substrate which is less than 1.2 times the combined areas of the second side of the substrate covered by the individual respective dies of the second set.

10. A memory cartridge comprising:
    a substrate having first and second opposed sides;
    a first set of memory dies, each having first and second opposed faces, mounted to the first side of the substrate with the respective first faces of the first set of memory dies facing the first side of the substrate;
    a second set of memory dies, each having first and second opposed faces, mounted to the second side of the substrate with the respective first faces of the second set of memory dies facing the second side of the substrate;
    a first thermally conductive cover mounted over the first set of memory dies, the first thermally conductive cover having first and second opposed surfaces, wherein the first surface of the first thermally conductive cover faces towards and is thermally coupled to the respective second faces of the first set of memory dies; and
    a second thermally conductive cover mounted over the second set of memory dies, the second thermally conductive cover having first and second opposed surfaces, wherein the first surface of the second thermally conductive cover faces towards and is thermally coupled to the respective second faces of the second set of memory dies.

11. The memory cartridge of claim 10, wherein the first set of memory dies are located on an area of the first side of the substrate which is less than 1.2 times the combined areas of the first side of the substrate covered by the individual respective memory dies of the first set.

12. The memory cartridge of claim 11, wherein the second set of memory dies are located on an area of the second side of the substrate which is less than 1.2 times the combined areas of the second side of the substrate covered by the individual respective memory dies of the second set.

13. The memory cartridge of claim 10 further comprising a first compliant thermally conductive pad located between the first set of memory dies and the first thermally conductive cover.

14. The memory cartridge of claim 13 further comprising a second compliant thermally conductive pad located between the second set of memory dies and the second thermally conductive cover.

* * * * *